(12) United States Patent
Li et al.

(10) Patent No.: US 11,916,053 B1
(45) Date of Patent: Feb. 27, 2024

(54) DISPLAY PANEL AND DISPLAY DEVICE

(71) Applicant: HKC CORPORATION LIMITED, Shenzhen (CN)

(72) Inventors: Zeyao Li, Shenzhen (CN); Rongrong Li, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 18/207,692

(22) Filed: Jun. 9, 2023

(30) Foreign Application Priority Data

Sep. 23, 2022 (CN) .......................... 202211166064.X

(51) Int. Cl.
- *H01L 25/16* (2023.01)
- *H01L 25/075* (2006.01)
- *H01L 33/62* (2010.01)

(52) U.S. Cl.
CPC ........ *H01L 25/167* (2013.01); *H01L 25/0753* (2013.01); *H01L 33/62* (2013.01)

(58) Field of Classification Search
CPC .... H01L 25/0753; H01L 25/167; H01L 33/62
See application file for complete search history.

(56) References Cited

U.S. PATENT DOCUMENTS

| | | |
|---|---|---|
| 2004/0126911 A1 | 7/2004 | Kimura |
| 2010/0224872 A1 | 9/2010 | Kimura |
| 2018/0198020 A1 | 7/2018 | Lai et al. |
| 2018/0374828 A1* | 12/2018 | Liao ...................... H01L 25/167 |
| 2019/0302917 A1 | 10/2019 | Pan |
| 2020/0035146 A1 | 1/2020 | Pan |
| 2020/0035748 A1 | 1/2020 | Xia et al. |
| 2021/0005582 A1 | 1/2021 | Zhao |

(Continued)

FOREIGN PATENT DOCUMENTS

| | | |
|---|---|---|
| CN | 103314488 A | 9/2013 |
| CN | 104731405 B | 1/2018 |

(Continued)

OTHER PUBLICATIONS

«Applied Sciences» , Jul. 24, 2022 ; Zhang Chaoqiang , Strain Relaxation Effect on the Peak Wavelength of Blue InGaN/GaN Multi-Quantum well Micro-LEDs;(11 pages).

(Continued)

*Primary Examiner* — Antonio B Crite

(57) ABSTRACT

A display panel and a display device are provided. The display panel includes a drive substrate, a bonding layer, and multiple light-emitting components. The drive substrate includes multiple sets of pads. Each set of pads includes a first pad and a second pad. The bonding layer is arranged on the multiple sets of pads. Each light-emitting component includes a semiconductor light-emitting layer, a first electrode, and a second electrode. The first electrode and the second electrode are arranged at opposite ends of the semiconductor light-emitting layer. The first electrode is electrically connected to a corresponding first pad through the bonding layer. The second electrode is electrically connected to a corresponding second pad through the bonding layer. The second electrodes of the adjacent light-emitting components are close to each other. The second electrodes close to each other are shorted through the same bonding layer and/or the same second pad.

20 Claims, 8 Drawing Sheets

(56) References Cited

U.S. PATENT DOCUMENTS

| | | |
|---|---|---|
| 2021/0202601 A1 | 7/2021 | Yuan et al. |
| 2021/0295761 A1 | 9/2021 | Wu |
| 2021/0343230 A1 | 11/2021 | Wang et al. |
| 2021/0384176 A1 | 12/2021 | Yin |
| 2021/0398954 A1 | 12/2021 | Gu et al. |
| 2022/0216183 A1 | 7/2022 | Wang et al. |

FOREIGN PATENT DOCUMENTS

| | | |
|---|---|---|
| CN | 207425855 U | 5/2018 |
| CN | 108646451 A | 10/2018 |
| CN | 109037270 A | 12/2018 |
| CN | 109300886 B | 7/2020 |
| CN | 111430339 A | 7/2020 |
| CN | 112242476 A | 1/2021 |
| CN | 113421893 A | 9/2021 |
| CN | 114038951 A | 2/2022 |
| CN | 114823635 A | 7/2022 |
| CN | 114975507 A | 8/2022 |
| CN | 114975740 A | 8/2022 |
| JP | 2006173265 A | 6/2006 |
| WO | 2021017499 A1 | 2/2021 |
| WO | 2021197188 A1 | 10/2021 |
| WO | 2022188107 A1 | 9/2022 |

OTHER PUBLICATIONS

«Journal of Luminescence» Issue 10, Oct. 14, 2020; Yan Ziwen et al., Research progress on highly integrated uLED display technology;(27 pages).

Chinese First Office Action,Chinese Application No. 202211166064.X, dated Mar. 21, 2022 (13 pages).

Notification to Grant Patent Right for Invention, Chinese Application No. 202211166064.X, dated Aug. 17, 2022 (7 pages).

* cited by examiner

US 11,916,053 B1

DISPLAY PANEL AND DISPLAY DEVICE

CROSS REFERENCE

The present disclosure claims priority of Chinese Patent Application No. 202211166064.X, filed on Sep. 23, 2022, the entire contents of which are hereby incorporated by reference in its entirety.

TECHNICAL FIELD

The present disclosure relates to the field of display technologies, and in particular to a display panel and display device.

BACKGROUND

Inorganic micro light-emitting diode (Micro-LED) has become one of the hot spots in the present display field for research due to its high reliability, low power consumption, high brightness, and fast response.

At present, light-emitting components of a Micro-LED display panel are generally bonded to a drive substrate through massive transfer, so that the light-emitting components are arranged in an array on the drive substrate to form the display panel.

However, the light-emitting components are affected by the accuracy of massive transfer, resulting in a great limitation of the distance between light-emitting components, which may not meet the requirement of higher resolution (Pixels Per Inch, PPI) of display panels.

SUMMARY OF THE DISCLOSURE

In an aspect, a technical solution applied in the present disclosure is providing a display panel. The display panel includes a drive substrate, a bonding layer and a plurality of light-emitting components. The drive substrate includes a plurality of sets of pads. Each set of pads includes a first pad and a second pad. The bonding layer is arranged on the multiple sets of pads. Each light-emitting component includes a semiconductor light-emitting layer, a first electrode, and a second electrode; the first electrode and the second electrode are respectively arranged at opposite ends of the semiconductor light-emitting layer; the first electrode is electrically connected to a corresponding first pad through the bonding layer; and, the second electrode is electrically connected to a corresponding second pad through the bonding layer; the second electrodes of at least part of the adjacent light-emitting components are close to each other; the distance between the second electrodes of the adjacent light-emitting components is less than the distance between the first electrodes of the adjacent light-emitting components; the second electrodes close to each other share a same bonding layer, and are each bonded to each of the corresponding second pads through the same bonding layer; or the second electrodes close to each other are each bonded to a same second pad through each of the corresponding bonding layers; or the second electrodes close to each other are each bonded to a same second pad through a same bonding layer; wherein, the second electrodes close to each other are connected to a same signal.

In another aspect, another technical solution applied in the present disclosure is providing a display device. The display device includes a display panel, a driving module applied to drive the display panel, and a housing. The display panel includes a drive substrate, a bonding layer and a plurality of light-emitting components. The drive substrate includes a plurality of sets of pads. Each set of pads includes a first pad and a second pad. The bonding layer is arranged on the multiple sets of pads. Each light-emitting component includes a semiconductor light-emitting layer, a first electrode, and a second electrode; the first electrode and the second electrode are respectively arranged at opposite ends of the semiconductor light-emitting layer; the first electrode is electrically connected to a corresponding first pad through the bonding layer; and, the second electrode is electrically connected to a corresponding second pad through the bonding layer. The second electrodes of at least part of the adjacent light-emitting components are close to each other; the distance between the second electrodes of the adjacent light-emitting components is less than the distance between the first electrodes of the adjacent light-emitting components; the second electrodes close to each other share a same bonding layer, and are each bonded to each of the corresponding second pads through the same bonding layer; or the second electrodes close to each other are each bonded to a same second pad through each of the corresponding bonding layers; or the second electrodes close to each other are each bonded to a same second pad through a same bonding layer; and the second electrodes close to each other are connected to a same signal.

DETAILED DESCRIPTION

The technical solutions in some embodiments of the present disclosure will be clearly and completely described below in conjunction with the accompanying drawings in some embodiments of the present disclosure. Obviously, the described embodiments are only a part of embodiments of the present disclosure, and not all of them. Based on some embodiments of the present disclosure, all other embodiments obtained by the skilled in the art without creative labor fall within the scope of protection of the present disclosure.

The terms "first", "second" and "third" in the present disclosure are used for descriptive purposes only and are not to be construed as indicating or implying relative importance, or implicitly specifying the number of indicated technical features. Thus, a feature qualified with "first", "second", or "third" may include at least one such feature, either explicitly or implicitly. In the description of the present disclosure, "plurality" means at least two, e.g., two, three, etc., unless otherwise expressly and specifically limited. All directional indications (e.g., up, down, left, right, forward, backward. etc.) in the present disclosure are used only to explain the relative position relationship, movement, etc., between the components in a particular attitude (as shown in the accompanying drawings). If the particular attitude is changed, the directional indications are changed accordingly. In addition, the terms "comprise", "include" and "have", and any variations thereof are intended to cover non-exclusive inclusion. For example, a process, method, system, product, or apparatus including a series of steps or units, is not limited to the listed steps or units, but optionally also includes steps or units not listed, or optionally also includes other steps or units inherent to those processes, methods, products, or apparatus.

References to "embodiments" in the present disclosure mean that particular features, structures, or characteristics described in conjunction with the embodiments may be included in at least one embodiment of the present disclosure. The presence of the phrase at various positions in the specification does not necessarily mean the same embodiment, nor is it a separate or alternative embodiment that is mutually exclusive from other embodiments. It is understood, both explicitly and implicitly, by the skilled in the art that the embodiments described in the present disclosure may be combined with other embodiments.

The present disclosure is described in detail below in conjunction with the accompanying drawings and embodiments.

Figure 1A:
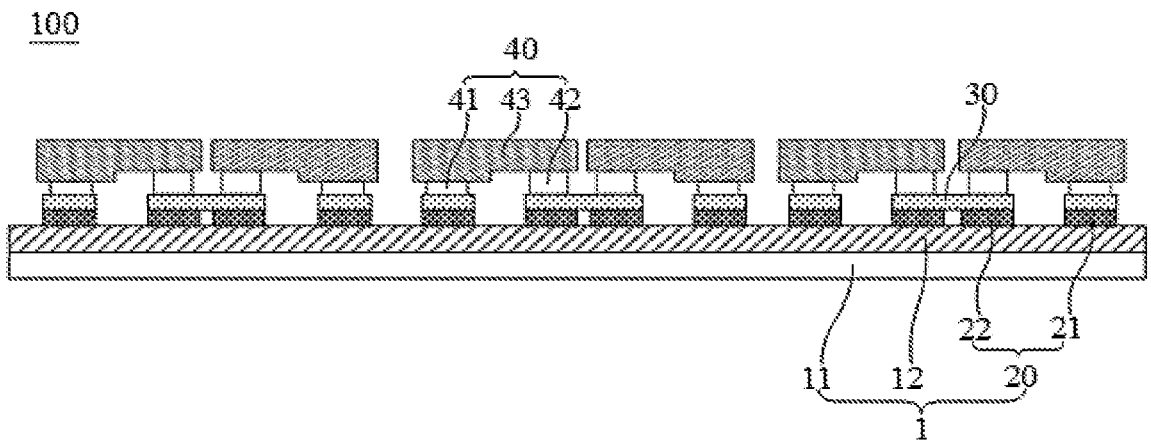
FIG. 1a is a cross-sectional structural schematic view of a first embodiment of a display panel provided in the present disclosure.
Figure 1B:
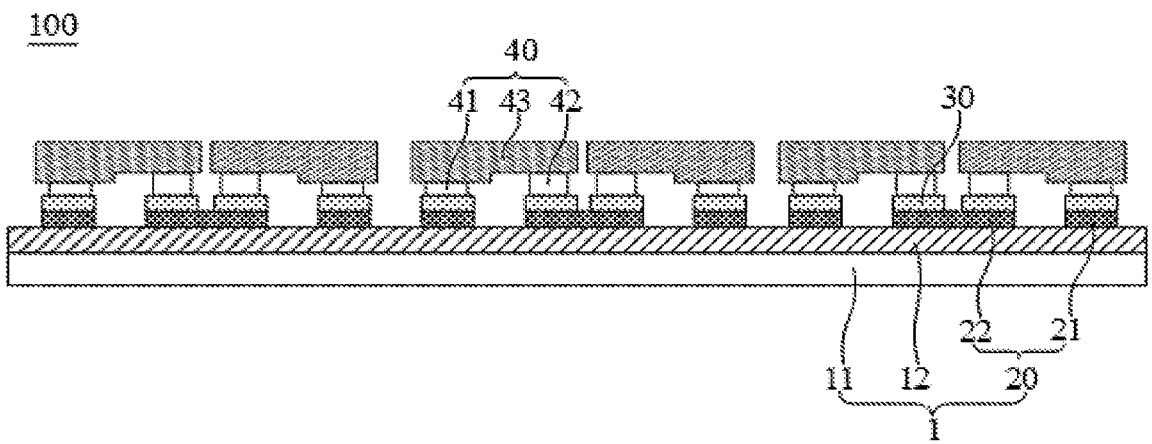
FIG. 1b is a cross-sectional structural schematic view of a second embodiment of the display panel provided in the present disclosure.
Figure 1C:
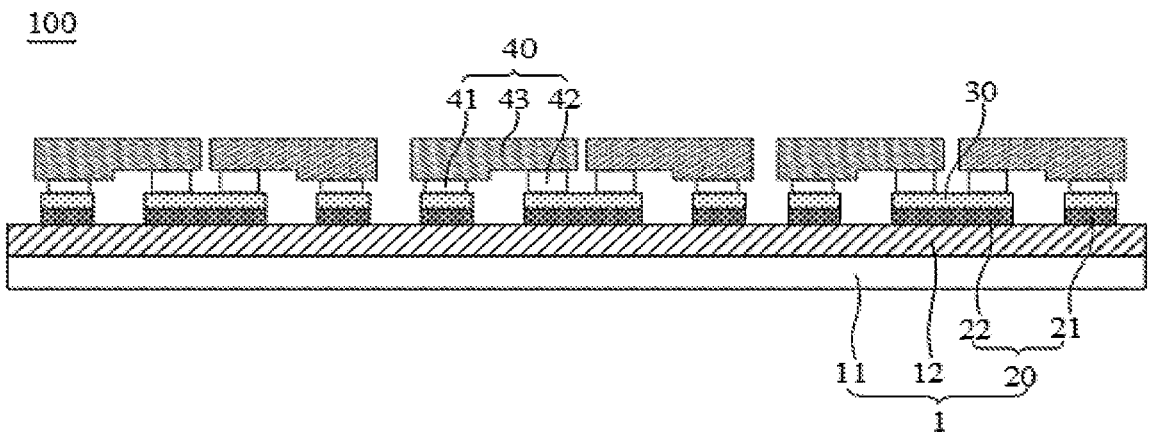
FIG. 1c is a cross-sectional structural schematic view of a third embodiment of the display panel provided in the present disclosure.

Referring to FIG. 1a, FIG. 1b, and FIG. 1c, FIG. 1a is a cross-sectional structural schematic view of a first embodiment of a display panel provided in the present disclosure; FIG. 1b is a cross-sectional structural schematic view of a second embodiment of the display panel provided in the present disclosure; and FIG. 1c is a cross-sectional structural schematic view of a third embodiment of the display panel provided in the present disclosure. Some embodiments of the present disclosure provide a display panel 100. The display panel 100 includes a drive substrate 1, a bonding layer 30, and multiple light-emitting components 40. The drive substrate 1 includes a base 11, a pixel drive circuit layer 12 arranged on one side of the base 11, and multiple sets of pads 20 arranged on the side of the pixel drive circuit layer 12 away from the base 11. The bonding layer 30 is arranged on the multiple sets of pads 20, and the light-emitting components 40 are electrically connected to a corresponding set of pads 20 through the bonding layer 30 so that the pixel driving circuit layer 12 may provide a corresponding drive signal to the light-emitting components 40 to make the light-emitting component 40 to emit light, thereby displaying a corresponding image on the display panel 100.

Specifically, each group of pads 20 includes a first pad 21 and a second pad 22. The bonding layer 30 is arranged on the first pad 21 and the second pad 22, respectively. The material of the pads 20 includes conductive materials, such as copper, silver, aluminum, iron, tin, and other metals or one or more of its alloys, or indium tin oxide (ITO), and other conductive materials. The specific material of the pads 20 is configured according to the actual requirements. The size and shape of the pads 20 may match the electrode of the light-emitting component 40. The arrangement of the first pads 21 and the second pads 22 may be configured according to the arrangement structure of the light-emitting components 40, so that each set of pads 20 and the light-emitting components 40 may be matched, thereby transmitting the corresponding drive signal to the light-emitting components 40 to display the corresponding image.

In some embodiments, each light-emitting component 40 includes a semiconductor light-emitting layer, a first electrode 41, and a second electrode 42. The first electrode 41 of the light-emitting component 40 may be an anode, and the second electrode 42 may be a cathode; in other embodiments, the first electrode 41 may be the cathode and the second electrode 42 may be the anode. The specific conditions may be configured according to the actual requirements, without limitation herein. Specifically, the first electrode 41 and the second electrode 42 are respectively arranged at opposite ends of a semiconductor light-emitting layer 43, and electrically connected to the semiconductor light-emitting layer 43 to form the light-emitting component 40. The first electrode 41 is electrically connected to the corresponding first pad 21 through bonding layer 30, and the second electrode 42 is electrically connected to the corresponding second pad 22 through bonding layer 30, to make the light-emitting component 40 and drive substrate 1 correspondingly connected, so that the drive signal is transmitted through the corresponding set of pads 20 to the light-emitting component 40, thereby lighting the light-emitting component 40 and displaying the corresponding image. Specifically, the light-emitting component 40 may be a current-driving light-emitting component 40 as an LED, such as a Micro-LED, Mini-LED, etc., wherein the size of the Mini-LED is 50 microns to 200 microns, and the size of the Micro-LED is less than 50 microns. In some embodiments, Micro LED is preferred as light-emitting component 40 to obtain Micro LED display panel 100.

In some embodiments, the display panel 100 also includes a cover or encapsulation layer (not shown in the drawings). The cover or encapsulation layer is arranged on the side of the multiple light-emitting components 40 away from the drive substrate 1. The cover or encapsulation layer covers the multiple light-emitting components 40 to isolate the light-emitting components 40 and the drive substrate 1 from the external environment, thereby protecting the light-emitting components 40 and the drive substrate 1 from the influence and damage of the external environment.

In some embodiment, the second electrodes 42 of at least part of the adjacent light-emitting components 40 are close to each other. The distance between the second electrodes 42 of the adjacent light-emitting components 40 is less than the distance between the first electrodes 41 of the adjacent light-emitting components 40. The second electrodes 42 close to each other may share a same bonding layer 30, and the second electrodes 42 are each bonded to each of the corresponding second pads 22 through a same bonding layer 30. Alternatively, the second electrodes 42 close to each other are each bonded to a same second pad 22 through each of the corresponding bonding layers 30, or the second electrodes close to each other are each bonded to a same second pad through a same bonding layer. The second electrodes close to each other are connected to a same signal. Through making the second electrodes 42 of at least part of the adjacent light-emitting components 40 close to each other, the distance between at least part of the light-emitting components 40 in the display panel 100 may be reduced, so that the distance between the light-emitting components 40 may be reduced, thereby increasing the resolution of the display panel 100 to meet the requirements of higher resolution.

It should be noted that the second electrodes 42 of the adjacent light-emitting components 40 are close to each other, indicating that the distance between the second electrodes 42 of the adjacent light-emitting components 40 is less than the distance between the first electrodes 41 of the adjacent light-emitting components. At the same time, the second electrodes 42 close to each other may receive the same signal. For example, all the second electrodes 42 close to each other receive VSS signals. It can also be understood that the second electrodes 42 of the adjacent light-emitting components which may receive the same signal are close to each other so that even if a short circuit occurs between the two second electrodes 42 close to each other, the signal abnormality will not occur causing a display abnormal problem in the light-emitting component 40. Hence, when the light-emitting components 40 massive transfer, it is unnecessary to consider the problem of a short circuit occurring in the signal between the pads 20 due to the distance between the pads 20 too close, making the distance between the light-emitting components 40 no longer affected by the transfer accuracy limitation, which can effectively reduce the distance between the light-emitting components 40, thereby improving the resolution of the display panel 100 to meet the requirements of higher resolution.

Further, in some embodiments, the second electrodes 42 of at least part of the adjacent light-emitting components 40 are close to each other, and the second electrodes 42 close to each other are shorted through the same bonding layer 30 and/or the same second pad, i.e., the second electrodes 42 of the adjacent light-emitting components 40 are close to each other. The second electrodes 42 close to each other share the same bonding layer 30. The second electrodes 42 are each bonded to each of the corresponding second pads 22 respectively through the same bonding layer 30, or the second electrodes 42 close to each other are each bonded to the same second pad 22 through each of the corresponding bonding layers 30 respectively, or the second electrodes 42 close to each other are each bonded to the same second pad 22 through the same bonding layer 30. Therefore, with this structure mentioned above, transferring the light-emitting component 40 to the drive substrate 1 may overcome the limitation of the fabrication limit of the light-emitting component 40, so that the distance between the adjacent light-emitting components 40 is reduced, thereby improving the resolution of the display panel 100 to meet the requirements for higher resolution.

Specifically, the bonding layer 30 of the display panel 100 includes multiple spaced sub-bonding layers. Multiple second electrodes 42 close to each other 42 are each bonded to each of the corresponding second pads 22 respectively through the same sub-bonding layer, or the multiple second electrodes 42 close to each other are each bonded to the same second pad 22 through each of the corresponding sub-bonding layers respectively, or the multiple second electrodes 42 close to each other are each bonded to the same second pad 22 through the same sub-bonding layer.

As shown in FIG. 1*a*, in the first embodiment, the multiple second electrodes 42 close to each other 42 are each bonded to each of the corresponding second pads 22 respectively through the same sub-bonding layer i.e., the second electrodes 42 close to each other share the same sub-bonding layer. As shown in FIG. 1*b*, in the second embodiment, the multiple second electrodes 42 close to each other are each bonded to the same second pad 22 through each of the corresponding sub-bonding layers respectively, i.e., the second electrodes 42 close to each other share the same second pad 22. As shown in FIG. 1*c*, in the third embodiment, the multiple second electrodes 42 close to each other are each bonded to the same second pad 22 through the same sub-bonding layer, i.e., the second electrodes 42 close to each other share the same sub-bonding layer and the same second pad 22.

Of course, in other embodiments, the multiple second electrodes 42 close to each other may also be each separately bonded to each of the multiple second pads through each of multiple sub-bonding layers, i.e., the multiple second electrodes 42 close to each other are separately bonded to their respective corresponding sub-bonding layers and to the corresponding second pads 22.

In the above embodiments, the adjacent light-emitting components 40 may be transferred as a whole bonding with the corresponding set of pads 20, or may also be transferred separately bonding with the corresponding set of pads 20, to reduce the distance between two or three adjacent light-emitting components 40, thereby effectively improving the resolution of the display panel 100. The specific use of the massive transfer method or separate transfer method may be selected according to actual requirements, without limitation herein.

It can be understood that the solutions involved in some embodiments of the present disclosure about making the second electrodes 42 of at least part of the adjacent light-emitting components 40 close to each other so that the second electrodes 42 close to each other may be each bonded to each of the corresponding second pads 22 respectively though the same bonding layer 30, or each bonded to the same second pads 22 through the corresponding bonding layer 30 respectively, may be applied to the arrangement structure of various pixel units 70 of the display panel 100, with a wide range of disclosure. Through the configuration of the solution, the resolution of the display panel 100 with the arrangement structure of various pixel units 70 may be improved. The display panel 100 involved in the above embodiments can be applied to a variety of display devices. In particular, the various arrangement structures of the pixel units 70 of the display panel 100 are described in the following embodiments.

Specifically, the display panel 100 includes multiple pixel units 70 arranged in an array, each pixel unit 70 includes three of the light-emitting components 40 in different colors.

The three different color light-emitting components 40 may be a red light-emitting component, a green light-emitting component, and a blue light-emitting component, so that the pixel units 70 may synthesize different colors of light by red light, green light, and blue light to present different colors of light, thereby the display panel 100 displaying the corresponding image. The specific arrangement structure of the light-emitting components 40 is specified as follows.

Figure 2:
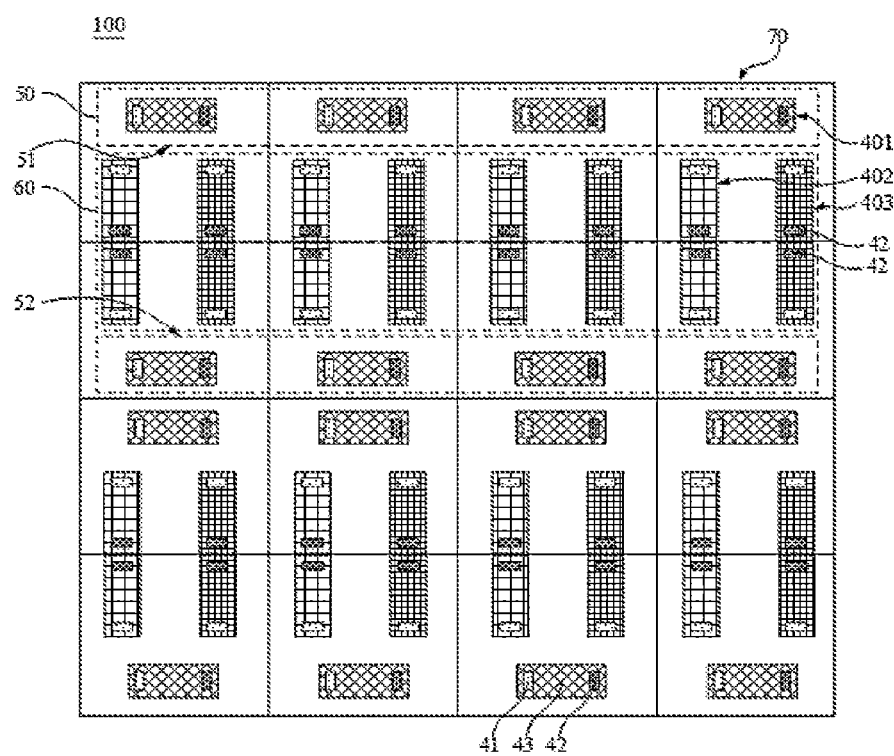
FIG. 2 is an arrangement structural schematic view of a first embodiment of pixel units provided in the present disclosure.

In a first embodiment, referring to FIG. 2, FIG. 2 is an arrangement structural schematic view of a first embodiment of pixel units provided in the present disclosure. In the embodiment, the second electrodes 42 of the two adjacent light-emitting components 40 in two rows of the pixel units 70 are close to each other. Specifically, each pixel unit 70 includes a first light-emitting component 401, a second light-emitting component 402, and a third light-emitting component 403 in different colors. The first light-emitting component 401, the second light-emitting component 402, and the third light-emitting component 403 may be a green light-emitting component, a blue light-emitting component, and a red light-emitting component, respectively. Multiple first light-emitting components 401 in a same row of the pixel units 70 are configured as a first row of light-emitting components 50. Multiple second light-emitting components 402 and multiple third light-emitting components 403 are alternately configured as a second row of light-emitting components 60. The second row of light-emitting components 60 in one row of pixel units 70 of two adjacent rows of pixel units 70 are arranged at a first side 51 of the first row of light-emitting components 50 in a column direction; the second row of light-emitting components 60 in another row of pixel units 70 of two adjacent rows of pixel units 70 are arranged at a second side 52 of the first row of light-emitting components 50 in the column direction, so that two rows of the second rows of light-emitting components 60 in two adjacent rows of pixel units 70 are adjacent to each other or two rows of the first rows of light-emitting components 50 are adjacent to each other. More specifically, the second light-emitting components 402 and the third light-emitting components 403 in each of the two adjacent rows are adjacent, or the first light-emitting components 401 in each of the two adjacent rows are adjacent.

In the embodiment, the first electrode 41 and the second electrode 42 of the first light-emitting component 401 are spaced along the row direction; the first electrode 41 and the second electrode 42 of the second light-emitting component 402 are spaced along the column direction; and the first electrode 41 and the second electrode 42 of the third light-emitting component 403 are spaced along the column direction. As shown in FIG. 2, the first electrode 41 and the second electrode 42 of the first light-emitting component 401 are located in a straight line parallel to the row direction; the first electrode 41 and the second electrode 42 of the second light-emitting component 402 and the third light-emitting component 403 are located in a straight line parallel to the column direction.

In the embodiment, the second electrodes 42 of two adjacent second light-emitting components 402 in two adjacent rows of pixel units 70 are close to each other and overlap in the column direction, and the second electrodes 42 of two adjacent third light-emitting components 403 in two adjacent rows of pixel units 70 are close to each other and overlap in the column direction. That is, the two adjacent second light-emitting components 402 in two adjacent rows of pixel units 70 are located in the same line in the column direction, and the second electrodes 42 of the two second light-emitting components 402 are close to each other. It can be understood that the two adjacent second light-emitting components 402 are arranged in a head-to-head arrangement, which means the ends of second light-emitting components 402 where the heads touch with each other is the ends of second light-emitting components 402 where the second electrodes 42 are located. Similarly, the two adjacent third light-emitting components 403 in two adjacent rows of pixel units 70 are located in the same line in the column direction, and the second electrodes 42 of the two third light-emitting components 403 are close to each other. It can be understood that the two adjacent second light-emitting components 402 are arranged in the head-to-head arrangement, and the two adjacent third light-emitting components 403 are also arranged in the head-to-head arrangement. The ends of the third light-emitting components 403 where the heads touch with each other are the ends of the third light-emitting components 403 where the second electrodes 42 are located. Specifically, in the embodiment, along the column direction, two of the second light-emitting components 402 in two adjacent rows of pixel units 70 are adjacent; two of the third light-emitting components 403 in two adjacent rows of pixel units 70 are adjacent. That is, the two adjacent light-emitting components 40 in two adjacent rows of pixel units 70 are the light-emitting components 40 with the same color. The configuration is conducive to the light-emitting components 40 massive transfer fabrication, reducing the number of operations of massive transfer.

In the embodiment, through the configurations that the first electrode 41 and the second electrode 42 of the first light-emitting component 401 are spaced along the row direction; the first electrode 41, and the second electrode 42 of the second light-emitting component 402 are spaced along the column direction; and the first electrode 41 and the second electrode 42 of the third light-emitting component 403 are spaced along the column direction; the second electrodes 42 of two adjacent second light-emitting components 402 in two adjacent rows of pixel units 70 are close to each other and overlap in the column direction; and the second electrodes 42 of two adjacent third light-emitting components 403 in two adjacent rows of pixel units 70 are close to each other and overlap in the column direction, the distance between the adjacent second light-emitting components 402 are reducing in the column direction while the distance between the adjacent third light-emitting components 403 are reducing in the column direction, i.e., the distance between the light-emitting components 40 is reduced in the column direction, so that the light-emitting components 40 are arranged more compactly in the column direction, thereby effectively improving the resolution of the display panel 100 to meet the requirements of higher resolution.

Figure 3:
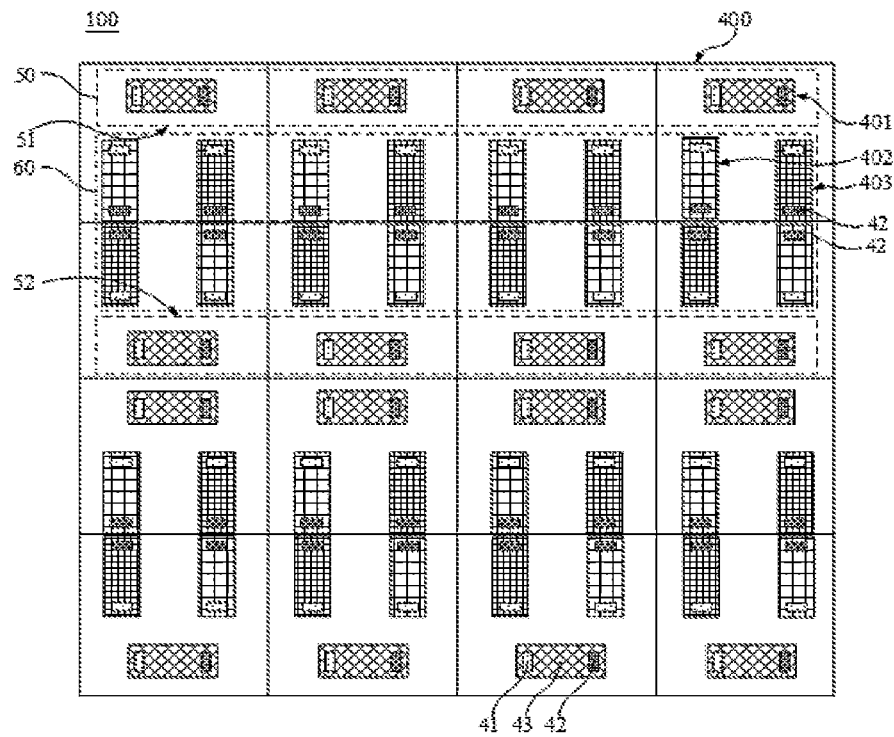
FIG. 3 is an arrangement structural schematic view of a second embodiment of the pixel units provided in the present disclosure.

In a second embodiment, referring to FIG. 3, FIG. 3 is an arrangement structural schematic view of a second embodiment of the pixel units provided in the present disclosure. Unlike the first embodiment, in the embodiment, in two adjacent rows of pixel units 70, the second row of light-emitting components 60 in one row of pixel units 70 is an alternating arrangement of multiple second light-emitting components 402 and multiple third light-emitting components 403, and the second row of light-emitting components 60 in the other row of pixel units 70 is another alternating arrangement of multiple third light-emitting components 403 and multiple second light-emitting components 402. That is, in two adjacent rows of pixel units 70, the color arrangement of the second row of light-emitting components 60 in one row of pixel units 70 is arranged in the order of blue-red alternately, and the color arrangement of the second row of light-emitting components 60 in the other row of pixel units 70 is arranged in the order of red-blue alternating arrangement, so that in two adjacent second rows of the light-emitting components 60, the second light-emitting components 402 in one row of the two adjacent second rows of the light-emitting components 60 and the third light-emitting component 403 in the other row of the two adjacent second rows of the light-emitting components 60 are adjacent. That is, adjacent light-emitting components 40 in two adjacent second rows of light-emitting components 60 is the light-emitting components 40 in different colors (the second light-emitting components 402 and the third light-emitting components 403). The electrodes of the adjacent second light-emitting components 402 and third light-emitting components 403 are close to each other and overlap in the column direction.

In the embodiment, through making the second light-emitting components 402 and the third light-emitting components 403 adjacent in the two adjacent rows of the second row of light-emitting components 60, and the second electrodes 42 of the adjacent second light-emitting components 402 and third light-emitting component 403 are close to each other and overlap in the column direction, the distance between the adjacent second light-emitting component 402 and third light-emitting component 403 in the column direction is reduced, i.e., the distance between the light-emitting components 40 is reduced in the column direction, so that the light-emitting components 40 are arranged more compactly in the column direction, thereby effectively improving the resolution of the display panel 100 to meet the requirements of higher resolution. At the same time, through making the second light-emitting component 402 and the third light-emitting component 403 of the two adjacent rows of the second rows of light-emitting components 60 in two adjacent rows of pixel units 70 alternately arranged in the opposite order, the light-emitting components 40 of each color are more evenly distributed on the display panel 100, thereby improving the color mixing effect among the pixel units 70 of the display panel 100 and enhancing the image display effect.

Figure 4:
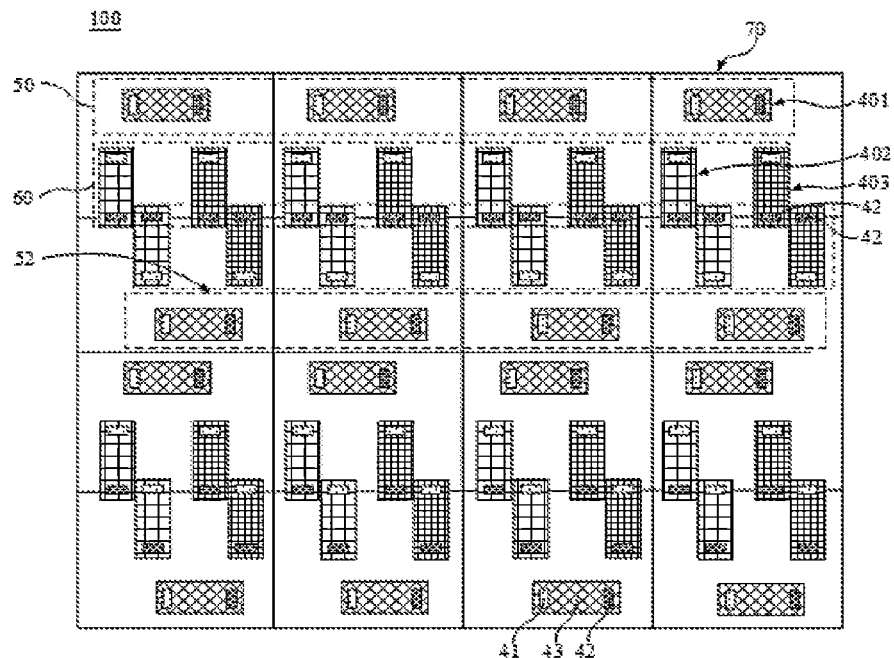
FIG. 4 is an arrangement structural schematic view of a third embodiment of the pixel units provided in the present disclosure.

In a third embodiment, referring to FIG. 4, FIG. 4 is an arrangement structural schematic view of a third embodiment of the pixel units provided in the present disclosure. Unlike in the first embodiment and the second embodiment, in the embodiment, the second electrodes 42 of two adjacent second light-emitting components 402 in two adjacent rows of pixel units 70 are close to each other and overlap in the row direction, and the second electrodes 42 of two adjacent third light-emitting components 403 in two adjacent rows of pixel units 70 are close to each other and overlap in the row direction. That is, the two adjacent second light-emitting components 402 in the two adjacent rows of pixel units 70 are partially staggered in the column direction, so that the second electrodes 42 of the two adjacent second light-emitting components 402 are close to each other and overlap in the row direction; similarly, the two adjacent third light-emitting components 403 in the two adjacent rows of pixel units 70 are partially staggered in the column direction, so that the second electrodes 42 of the two adjacent third light-emitting components 403 are close to each other and overlap in the row direction. Compared to the first embodiment and the second embodiment, the embodiment is arranged in such a way that the distance between the two adjacent second light-emitting components 402 is further reduced in the column direction while the two adjacent third light-emitting components 403 is further reduced in the column direction, so that the light-emitting components 40 are further arranged more compactly in the column direction, thereby further effectively improving the resolution of the display panel 100 to meet the requirements of higher resolution.

Figure 5:
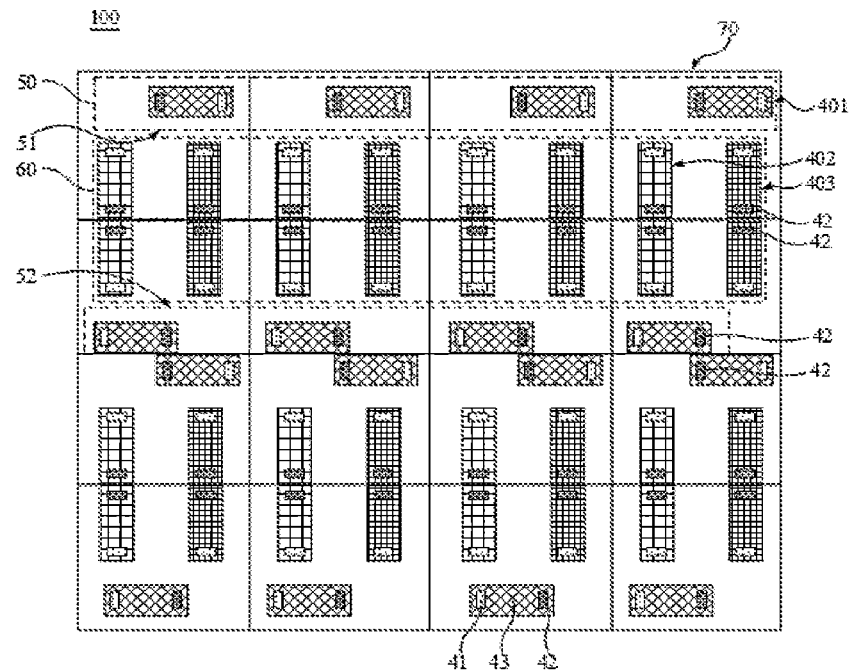
FIG. 5 is an arrangement structural schematic view of a fourth embodiment of the pixel units provided in the present disclosure.

In a fourth embodiment, referring to FIG. 5, FIG. 5 is an arrangement structural schematic view of a fourth embodiment of the pixel units provided in the present disclosure. Further, in the embodiment, the second electrodes 42 of two adjacent first light-emitting components 401 in two adjacent rows of pixel units 70 are close to each other. Specifically, the first electrode 41 and the second electrode 42 of the first light-emitting component 401 are spaced along the row direction. The two adjacent first light-emitting components 401 in two adjacent rows of pixel units 70 are partially staggered in the row direction, so that the second electrodes 42 of the two adjacent first light-emitting components 401 in two adjacent pixel units 70 are close to each other. That is, two adjacent first light-emitting components 401 in two adjacent rows of pixel units 70 are partially staggered in the row direction and close to each other in the column direction, so that the second electrodes 42 of two adjacent first light-emitting components 401 are close to each other.

In the embodiment, through the first electrode 41 and the second electrode 42 of the first light-emitting component 401 spaced along the row direction, two adjacent first light-emitting components 401 in two adjacent rows of pixel units 70 are partially staggered in the row direction, the second electrodes 42 of two adjacent first light-emitting components 401 in two adjacent pixel units 70 are close to each other, reducing the distance between two adjacent first light-emitting components 401 in the column direction, so that the light-emitting components 40 are arranged more compactly in the column direction, thereby effectively improving the resolution of the display panel 100 to meet the requirements of higher resolution. At the same time, the two adjacent first light-emitting components 401 in two adjacent rows of pixel units 70 are partially staggered in the row direction, reducing the corresponding distance among the second pads 22 of the same polarity that may share the same signal, and also avoiding the problem of short circuit among the pads 20 of different signals, thus contributing to the improvement of the resolution of the display panel 100. In specific embodiments, the first electrode 41 and the second electrode 42 of the first light-emitting component 401 may be spaced along the row direction while the first electrodes 41 and the second electrodes 42 of the first light-emitting components 401 in two adjacent rows of pixel units 70 may be partially staggered in the row direction at the same time, so that the second electrodes 42 of two adjacent first light-emitting components 401 in two adjacent rows of pixel units 70 are close to each other, the second electrodes 42 of the two adjacent second light-emitting components 402 in two adjacent rows of pixel units 70 are close to each other, and the second electrodes 42 of the two adjacent third light-emitting components 403 in two adjacent rows of pixel units 70 are close to each other, thereby the light-emitting components 40 on the display panel 100 more compactly arranged, the pixel unit 70 occupying a smaller area, and further improving the resolution of the display panel 100.

Figure 6:
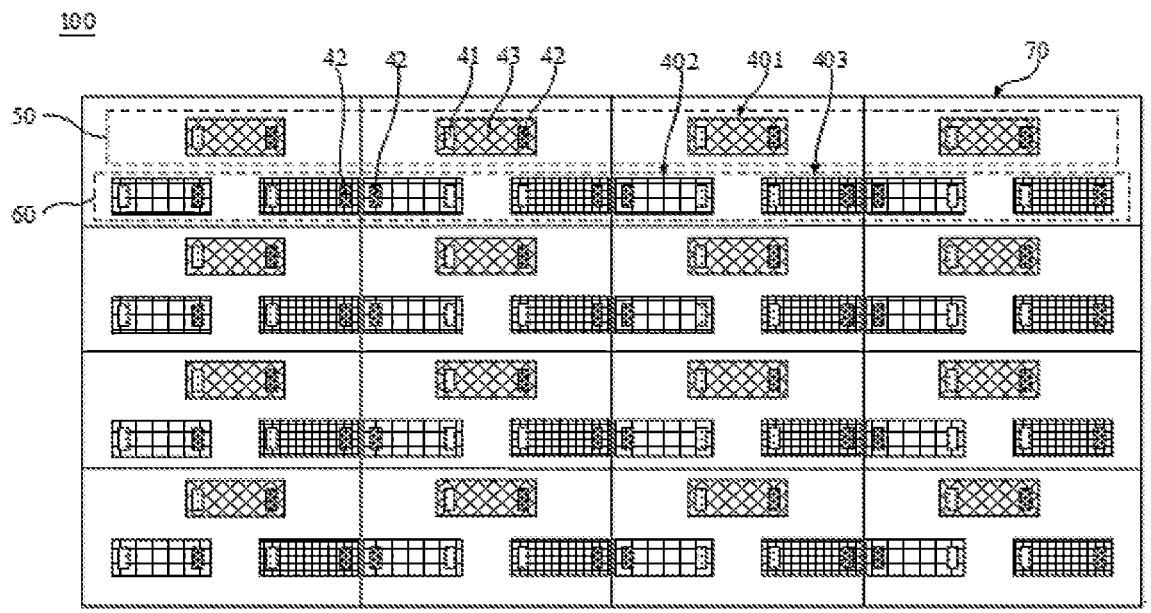
FIG. 6 is an arrangement structural schematic view of a fifth embodiment of the pixel units provided in the present disclosure.

In a fifth embodiment, see FIG. 6, FIG. 6 is an arrangement structural schematic view of a fifth embodiment of the pixel units provided in the present disclosure. In the embodiment, the second electrodes 42 of two adjacent light-emitting components 40 in two adjacent columns of pixel units 70 are close to each other. Specifically, the first electrode 41 and the second electrode 42 of the first light-emitting component 401, the second light-emitting component 402, and the third light-emitting component 403 are all spaced along the row direction. Specifically, in the same row of pixel units 70, multiple first light-emitting components 401 are configured as a first row of light-emitting components 50, multiple second light-emitting components 402, and multiple third light-emitting components 403 are alternately configured as a second row of light-emitting components 60. Along the column direction, the first row of light-emitting components 50 and the second row of light-emitting components 60 are alternately arranged. In the embodiment, along the row direction, the second electrodes 42 of two adjacent second light-emitting components 402 or two adjacent third light-emitting components 403 in two adjacent column pixel units 70 are close to each other and overlap in the row direction or the column direction. In the embodiment, along the row direction, the second electrodes 42 of two adjacent second light-emitting components 402 or two adjacent third light-emitting components 403 in two adjacent columns of pixel units 70 are close to each other and overlap in the row direction. In other embodiments, two adjacent second light-emitting components 402 or two adjacent third light-emitting components 403 in two adjacent columns of pixel units 70 may be partially staggered in the column direction, so that the second electrodes 42 of adjacent second light-emitting components 402 or adjacent two third light-emitting components 403 are close to each other.

In the embodiment, through making the second electrodes 42 of two adjacent light-emitting components 40 in two adjacent columns of pixel units 70 close to each other, the distance between the two adjacent light-emitting components 40 in the column direction is reduced, so that the light-emitting components 40 are arranged more compactly in the column direction, thereby effectively improving the resolution of the display panel 100.

Figure 7:
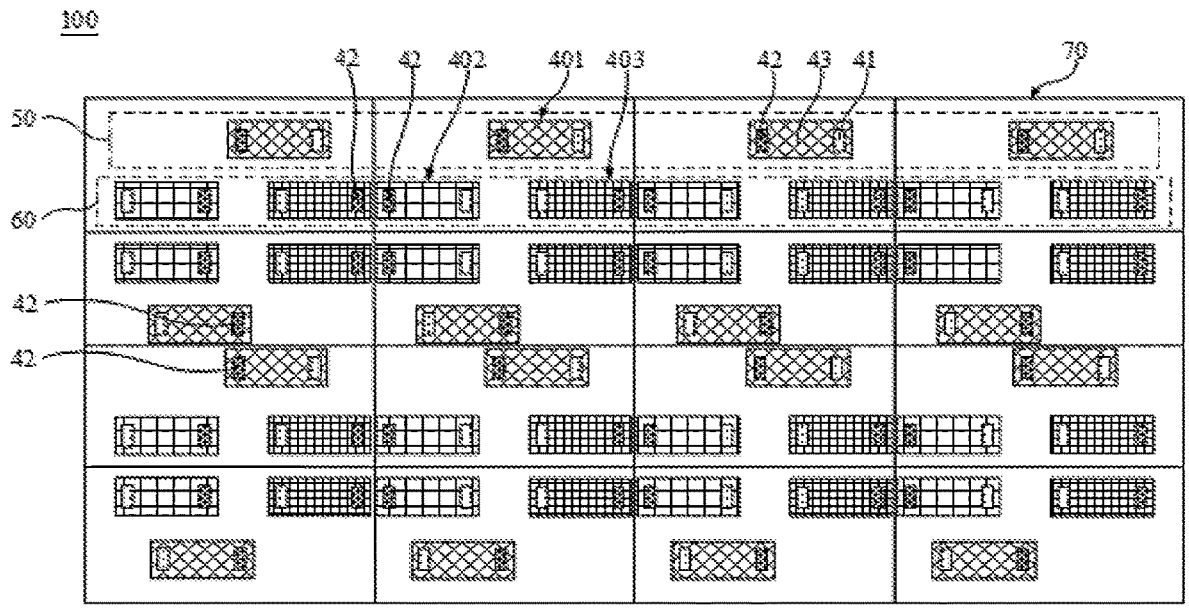
FIG. 7 is an arrangement structural schematic view of a sixth embodiment of the pixel units provided in the present disclosure.

In a sixth embodiment, referring to FIG. 7, FIG. 7 is an arrangement structural schematic view of a sixth embodiment of the pixel units provided in the present disclosure. Similar to the fourth embodiment, in the embodiment, the second electrodes 42 of two adjacent first light-emitting components 401 in two adjacent rows of pixel units 70 are close to each other. The second row of light-emitting components 60 in one row of the adjacent two rows of pixel units 70 is arranged along the column direction on the first side 51 of the first row of light-emitting components 50, and the second row of light-emitting components 60 in the other row of pixel units 70 is arranged along the column direction on the second side 52 of the first row of light-emitting components 50, so that the two first rows of light-emitting components 50 in the adjacent two rows of pixel units 70 are adjacent to each other. At the same time, the two adjacent first light-emitting components 401 in two adjacent rows of pixel units 70 are partially staggered in the row direction, so that the second electrodes 42 of the two adjacent first light-emitting components 401 in the two adjacent rows of pixel units 70 are close to each other, thereby reducing the distance between the two adjacent first light-emitting components 401 in the column direction. Hence, the light-emitting components 40 are arranged more compactly in the column direction, thereby effectively improving the resolution of the display panel 100. At the same time, the second electrodes 42 of two adjacent second light-emitting components 402 in two adjacent columns of pixel units 70 are closer to each other, and the second electrodes 42 of two adjacent third light-emitting components 403 in two adjacent columns of pixel units 70 are closer to each other, so that the light-emitting components 40 more compactly arranged on the display panel 100, and the area is occupied by the pixel units 70 smaller, thereby further improving the resolution of the display panel 100.

Figure 8:
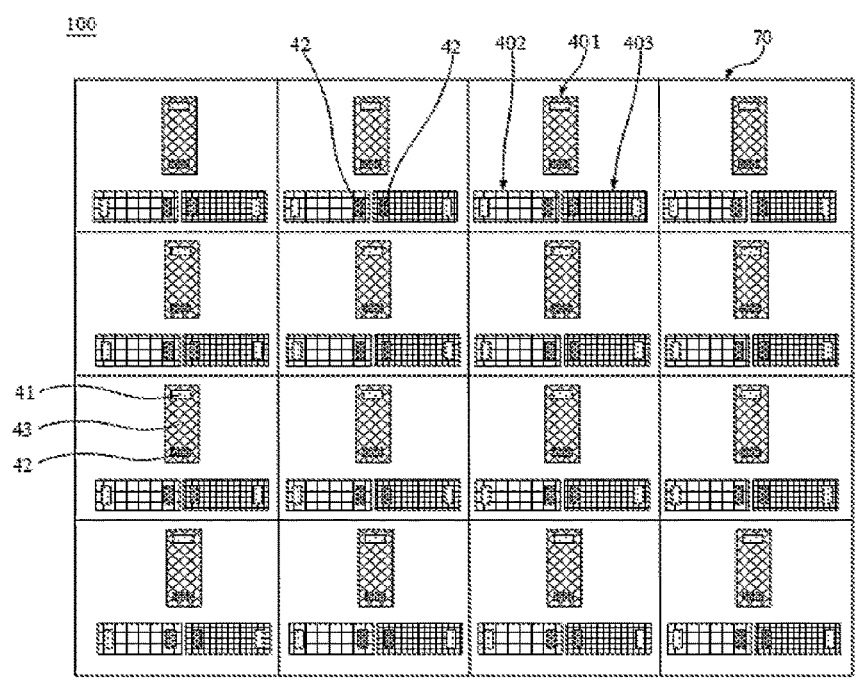
FIG. 8 is an arrangement structural schematic view of a seventh embodiment of the pixel units provided in the present disclosure.

In a seventh embodiment, referring to FIG. 8, FIG. 8 is an arrangement structural schematic view of a seventh embodiment of the pixel units provided in the present disclosure. In the embodiment, parts of the second electrodes 42 of two or three light-emitting components 40 in the same pixel unit 70 are close to each other. Specifically, the first electrodes 41 and the second electrodes 42 of two of the light-emitting components 40 in the same pixel unit 70 are spaced along the row direction, and the second electrodes 42 are close to each other; the first electrode 41 and the second electrode 42 of the other light-emitting component 40 are spaced along the column direction. Alternatively, in another embodiment, the first electrode 41 and the second electrode 42 of two of the light-emitting components 40 in the same pixel unit 70 are spaced along the column direction, and the second electrodes 42 are close to each other; the first electrode 41 and the second electrode 42 of the other light-emitting component 40 are spaced along the row direction. That is, in the same row pixel unit 70, multiple first light-emitting components 401 are arranged as a row, and multiple second light-emitting components 402 and multiple third light-emitting components 403 are alternately arranged as another row; the first electrode 41 and second electrode 42 of the first light-emitting component 401 are spaced along the column direction; the first electrodes 41 and second electrodes 42 of the second light-emitting component 402 and the third light-emitting component are spaced along the row direction. Or, in the same column pixel unit 70, multiple first light-emitting components 401 are arranged as a column, multiple second light-emitting components 402 and multiple third light-emitting components 403 are alternately arranged as another column; the first electrode 41 and the second electrode 42 of the first light-emitting component 401 are arranged along the row direction, and the first electrode 41 and the second electrode 42 of the second light-emitting component 402 and third light-emitting component 403 are arranged along the column direction.

In the embodiment, through making the second electrodes 42 of two of the light-emitting components 40 in the same pixel unit 70 close to each other, the distance between two of the light-emitting components 40 in the same pixel is reduced, so that the area in the same pixel is reduced, and the pixels on the display panel 100 are more compactly arranged with each other, thereby effectively improving the resolution of the display panel 100.

Figure 9:
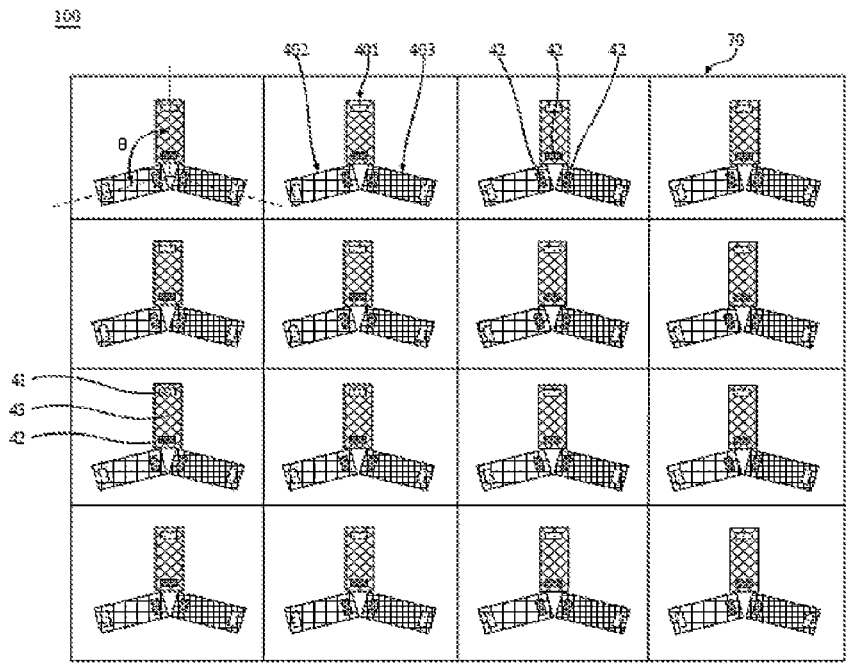
FIG. 9 is an arrangement structural schematic view of an eighth embodiment of the pixel units provided in the present disclosure.

Referring to FIG. 9, FIG. 9 is an arrangement structural schematic view of an eighth embodiment of the pixel units provided in the present disclosure. In the embodiment, the second electrodes 42 of the three light-emitting components 40 in the same pixel unit 70 are close to each other, and the three light-emitting components 40 in the same pixel unit 70 are arranged along the circumference. The angle θ between one of the light-emitting components 40 and its adjacent light-emitting components 40 in the same pixel unit 70 is between 90° and 180°. In other words, the three light-emitting components 40 in the same pixel unit 70 are arranged in a "Y" shape, and the angle θ between one of the light-emitting components 40 and its adjacent light-emitting components 40 in the same pixel unit 70 may be arranged according to actual requirements, so that the display panel 100 may achieve a better display effect.

In the embodiment, through making the second electrode 42 of the three light-emitting components 40 in the same pixel unit 70 close to each other, and the three light-emitting components 40 in the same pixel unit 70 arranged along the circumference, the distance between each two of the three light-emitting components 40 in the same pixel is reduced to each other, so that the area in the same pixel is further reduced, and the pixels on the display panel 100 are more compactly arranged to each other, thereby further effectively improving the resolution of the display panel 100.

Figure 10:
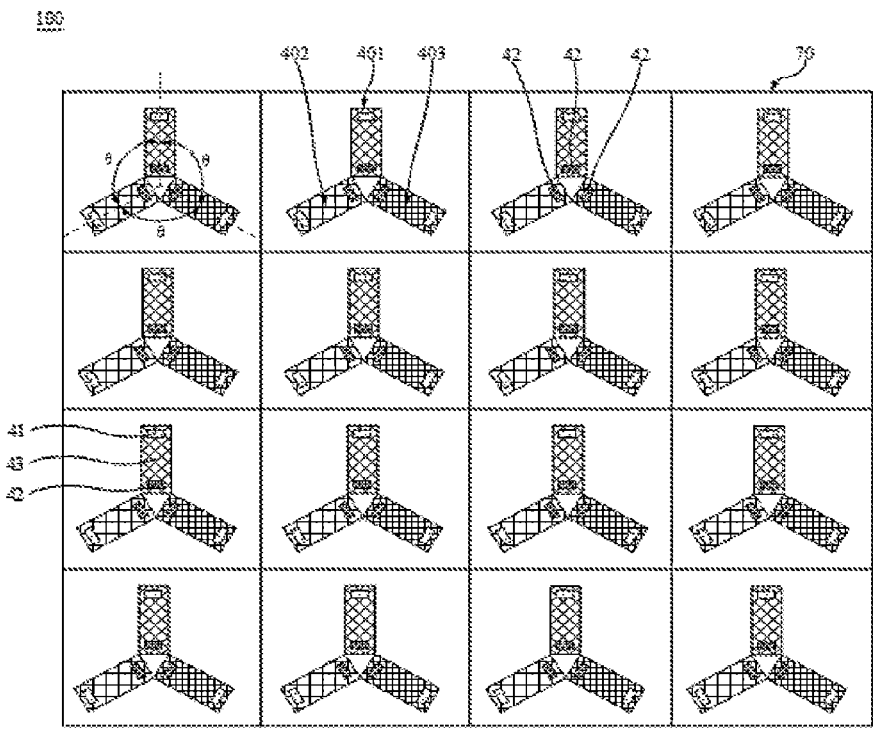
FIG. 10 is an arrangement structural schematic view of a ninth embodiment of the pixel units provided in the present disclosure.

Referring to FIG. 10, FIG. 10 is an arrangement structural schematic view of a ninth embodiment of the pixel units provided in the present disclosure. In the embodiment, the second electrodes 42 of the three light-emitting components 40 in the same pixel unit 70 are close to each other. The three light-emitting components 40 in the same pixel unit 70 are arranged along the circumference in a same spacing. That is, when the three light-emitting components 40 in the same pixel unit 70 are arranged in a "Y" shape, the angle θ between one of the light-emitting components 40 and its adjacent light-emitting components 40 is 120°. Compared with the eighth embodiment, in the embodiment, the distribution of the three light-emitting components 40 in the same pixel unit 70 is more balanced, so that the distribution of the light-emitting components 40 in different colors of the display panel 100 is more balanced, leading to a better color mixing effect, thereby improving the image display effect of the display panel 100.

Figure 11:
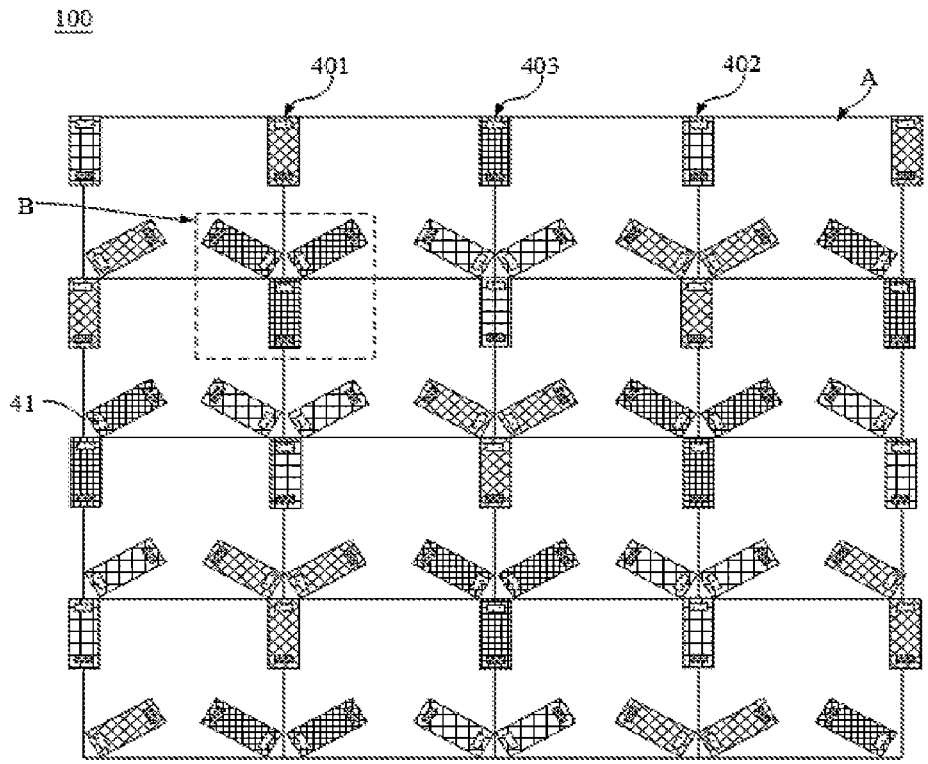
FIG. 11 is an arrangement structural schematic view of a tenth embodiment of the pixel units provided in the present disclosure.

Referring to FIG. 11, FIG. 11 is an arrangement structural schematic view of a tenth embodiment of the pixel units provided in the present disclosure. In the embodiment, the display panel 100 includes multiple arrays sub-units A arranged in an array. At the crossover point of adjacent array subunits A, three identical light-emitting components 40 are spaced along the circumference centered at the crossover point. The second electrodes of the three identical light-emitting components 40 are close to each other to form a sub-pixel group B centered at the crossover point. Along the row direction and/or the column direction of the multiple crossover points, the sub-pixel groups B are arranged in a preset order of the first light-emitting components 401, the second light-emitting components 402, and the third light-emitting components 403 in alternating. The preset order may be "first light-emitting component 401-second light-emitting component 402-third light-emitting component 403", "second light-emitting component 402-third light-emitting component 403-first light-emitting component 401", or "third light-emitting component 403-first light-emitting component 401-second light-emitting component 402". For example, in the first row of crossover points, sub-pixel groups B alternates in the order of "first light-emitting component 401-second light-emitting component 402-third light-emitting component 403"; in the second row of crossover points, sub-pixel groups B alternates in the order of "second light-emitting component 402-third light-emitting component 403-first light-emitting component 401"; in the third row of crossover points, sub-pixel groups B alternates in the order of "third light-emitting component 403-first light-emitting component 401-second light-emitting component 402". The first to the third row is a cycle, and the first to last row is arranged in accordance with the cycle of the first to the third row. Through the arrangement, in each row of subunits A, the first light-emitting component 401, the second light-emitting component 402, and the third light-emitting component 403 are arranged, so that the distribution of the light-emitting components 40 in different colors of the display panel is more balanced, leading to a better color mixing effect, thereby improving the image display effect of the display panel 100.

Figure 12:
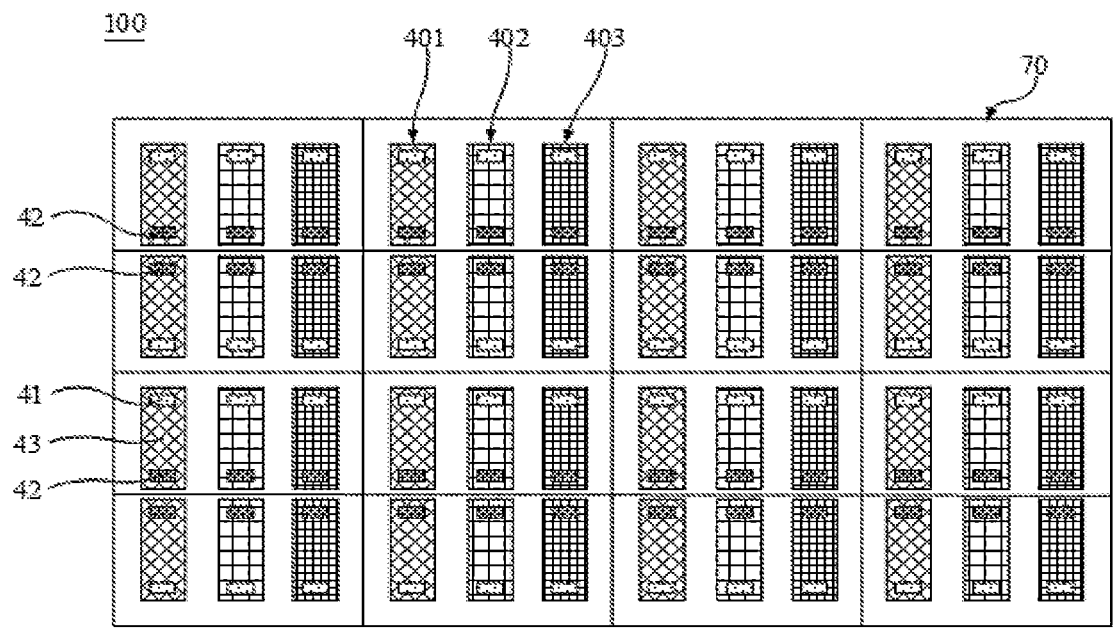
FIG. 12 is an arrangement structural schematic view of an eleventh embodiment of the pixel units provided in the present disclosure.

Referring to FIG. 12, FIG. 12 is an arrangement structural schematic view of an eleventh embodiment of the pixel units provided in the present disclosure. Unlike the above embodiments, in the embodiment, the display panel 100 includes multiple pixel units 70 arranged in an array. Each pixel unit 70 includes three light-emitting components 40 in different colors. Each light-emitting component 40 also includes a quantum dots layer (not shown). The semiconductor light-emitting layers of the three light-emitting components in different colors are in a same color. The quantum dots layers of the three light-emitting components in different colors are three different types of quantum dots layers. The different types of quantum dot layers may convert light from the light-emitting semiconductor layer 43 to different colors, so that different colors of light may be mixed to get more colors of light.

Specifically, multiple light-emitting components 40 in each row of pixel units 70 are alternately arranged in a same row based on a preset color order along the row direction, and the first electrode 41 and the second electrode 42 of the light-emitting components 40 are spaced along the column direction. Each row of the pixel units 70 is close to the second electrodes 42 of two adjacent light-emitting components 40 in one of the adjacent rows of the pixel units. That is, the first electrodes 41 and second electrodes 42 of all light-emitting components 40 are spaced along the column direction, and alternate along the row direction in a preset color order. For example, multiple light-emitting components 40 in each row of pixel units 70 are alternately arranged in the order of "red-green-blue" alternately in a row.

In the embodiment, multiple light-emitting components 40 of each pixel unit 70 are arranged in a row in a preset color order, simplifying the arrangement of light-emitting components 40. Compared to the above-mentioned embodiments, the arrangement may make the light-emitting components 40 in the pixel unit 70 more compact, which may further improve the resolution of the display panel 100. At the same time, since the light-emitting semiconductor layer 43 of the different-color light-emitting components 40 have the same color, i.e., the same color LEDs are used, the arrangement is simpler, allowing the LEDs to be transferred to the drive substrate 1 at one operation, which effectively ensures transfer alignment accuracy. At the same time, through the arrangement that each row of the pixel units 70 is close to the second electrodes 42 of two adjacent light-emitting components 40 in one of the adjacent rows of the pixel units 70, not only may reduce the distance between the adjacent light-emitting components 40, making the arrangement in the column direction more compact and improving the resolution of the display panel 100, but also may allow the two adjacent rows of light-emitting components 40 close to each other to share the same common signal lines (such as VSS signal lines), so that the number of common signal lines on the drive substrate 1 may be greatly reduced, reducing the area occupied by the common signal lines, thus increasing more design area for other alignments or components.

It is easy to understand that in the above first embodiment to the tenth embodiment, the light-emitting component 40 may also be the light-emitting component 40 in the eleventh embodiment. That is, the light-emitting component 40 also includes a quantum dots layer (not shown). The light-emitting semiconductor layer 43 of the first light-emitting component 401, the light-emitting semiconductor layer 43 of the second light-emitting component 402, and the light-emitting semiconductor layer 43 of the third light-emitting component 403 are a same color, the quantum dots layers of the first light-emitting component 401, the second light-emitting component 402, and the third light-emitting component 403 are three different types of quantum dots layers. The different types of quantum dot layers may convert light from the light-emitting semiconductor layer 43 to different colors, so that different colors of light may be mixed to allow the pixel units to emit more colors of light.

In all of the above embodiments, the arrangement of the light-emitting components 40 in different colors may be configured as the arrangement of the second electrodes 42 close to each other, to improve the resolution of the display panel 100. The second electrodes 42 of adjacent light-emitting components 40 are connected to the same signal (such as VSS signal). Hence, it is unnecessary to consider the problem of a short circuit caused by the distance between the second pads 22 corresponding to the two adjacent light-emitting components being too short, thereby overcoming the limitation of the fabrication limit of the massive transfer of the light-emitting components 40. Among them, the first electrode 41 and the second electrode 42 may be anode and cathode, respectively, or, the first electrode 41 and the second electrode 42 may also be cathode and anode, respectively, without limitation herein.

Specifically, continuous referring to FIG. 1a, FIG. 1b and FIG. 1c, in the above embodiments, the second electrodes 42 of the light-emitting components 40 close to each other are close to each other, and the second electrodes 42 close to each other may be connected to the same signal, so that, for convenience of transfer and alignment bonding, the second electrodes 42 close to each other may be separately bonded to each of the corresponding second pads 22 through the same bonding layer 30, or separately bonded to the same second pad 22 through each of the corresponding bonding layer 30.

Figure 13:
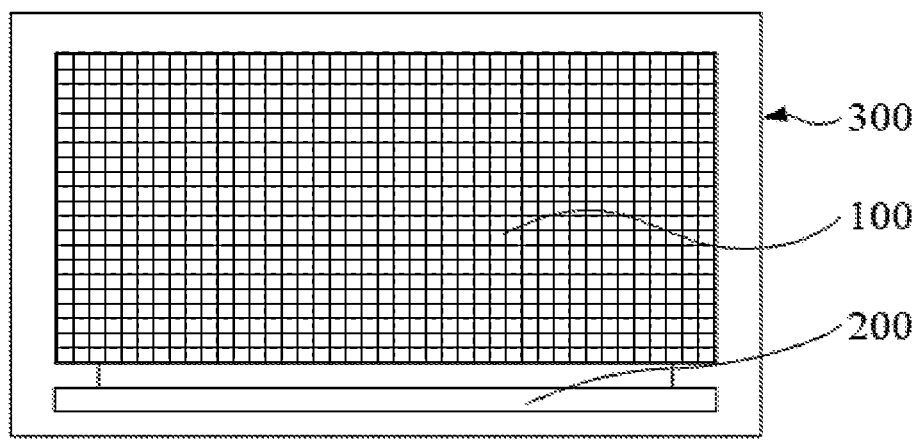
FIG. 13 is a structural schematic view of a display device provided in some embodiments of the present disclosure.

Referring to FIG. 13, FIG. 13 is a structural schematic view of the display device provided in some embodiments of the present disclosure. In the embodiment, a display device is provided, including a display panel 100 and a driver module 200 electrically connected to the display panel 100. The display panel 100 is configured to display an image. Specifically, the display panel 100 may be the display panel 100 involved in any one of the above embodiments. The specific structure and function of the display panel 100 is the same as or similar to the structure and function of the display panel 100 involved in the above embodiment. The display panel in the embodiment may achieve the same technical effect as the display panel mentioned above, which will not be repeated herein, as can be seen above.

Among them, the drive module 200 is configured to provide a drive scan signal to the drive substrate 1 of the display panel 100, so that the drive substrate 1 drives the light-emitting component 40 to display an image. Specifically, the drive module 200 may include a gate drive module and a source drive module. The gate drive module provides a gate scan signal to the drive substrate 1, and the source drive module provides a source scan signal to the drive substrate 1.

Further, the display device further includes a housing 300. Both the display panel 100 and the driver module 200 are arranged in the housing 300. The housing 300 is configured to protect the display panel 100 and the driver module 200 from being affected and damaged by the external environment.

The above is only some embodiments of the present disclosure, and not to limit the scope of the patent of the present disclosure. Any equivalent structure or equivalent process transformation made by using the content of the specification of the present disclosure and the accompanying drawings, or applied directly or indirectly in other related technical fields, are included in the scope of patent protection of the present disclosure in the same way.

What is claimed is:

1. A display panel, comprising:
   a drive substrate, comprising a plurality of sets of pads, wherein each set of pads comprises a first pad and a second pad;
   a bonding layer, arranged on the plurality of sets of pads; and
   a plurality of light-emitting components, wherein each light-emitting component comprises a semiconductor light-emitting layer, a first electrode, and a second electrode; the first electrode and the second electrode are respectively arranged at opposite ends of the semiconductor light-emitting layer; the first electrode is electrically connected to a corresponding first pad through the bonding layer; and, the second electrode is electrically connected to a corresponding second pad through the bonding layer;
   wherein the second electrodes of at least part of the adjacent light-emitting components are close to each other; the distance between the second electrodes of the adjacent light-emitting components is less than the distance between the first electrodes of the adjacent light-emitting components; the second electrodes close to each other share a same bonding layer, and are each bonded to each of the corresponding second pads through the same bonding layer; and the second electrodes close to each other are connected to a same signal.

2. The display panel as claimed in claim 1, comprising a plurality of pixel units arranged in an array, wherein
   each pixel unit comprises three of the light-emitting components in different colors; each light-emitting component comprises a quantum dots layer; the semiconductor light-emitting layers of the three of the light-emitting components in different colors are in a same color; the quantum dots layers of the three of the light-emitting components in different colors are three different types of quantum dots layers;
   a plurality of light-emitting components in each row of the pixel unit are alternately arranged in a same row based on a preset color order along the row direction; and the first electrodes and the second electrodes of the light-emitting components are spaced along the column direction; each row of the pixel units is close to the second electrodes of two adjacent light-emitting components in one of the adjacent rows of the pixel units.

3. The display panel as claimed in claim 1, wherein
   the bonding layer comprises a plurality of spaced sub-bonding layers; and a plurality of the second electrodes close to each other are each bonded to each of a plurality of the corresponding second pads respectively through the same sub-bonding layer.

4. The display panel as claimed in claim 1, further comprising a plurality of pixel units arranged in an array, wherein each pixel unit comprises three of the light-emitting components in different colors and
   the second electrodes of two adjacent light-emitting components in two adjacent rows of the pixel units are close to each other.

5. The display panel as claimed in claim 4, wherein
   the first electrodes and the second electrodes of two of the light-emitting components in the same pixel unit are spaced along the row direction; and the second electrodes of the two light-emitting components in the same pixel unit are close to each other; the first electrode and the second electrode of the other light-emitting component in the same pixel unit are spaced along the column direction.

6. The display panel as claimed in claim 4, wherein the second electrodes of the three light-emitting components in the same pixel unit are close to each other; the three light-emitting components in the same pixel unit are arranged along the circumference; the angle between one of the light-emitting components and its adjacent light-emitting components in the same pixel unit is 90 to 180 degrees.

7. The display panel as claimed in claim 4, wherein the second electrodes of the three light-emitting components in the same pixel unit are close to each other; the three light-emitting components in the same pixel unit are arranged along the circumference in a same spacing.

8. The display panel as claimed in claim 4, wherein each of the pixel units comprises a first light-emitting component, a second light-emitting component, and a third light-emitting component in three different colors; a plurality of the first light-emitting components in a same row of the pixel units are configured as a first row of light-emitting components; a plurality of the second light-emitting components and a plurality of the third light-emitting components are alternately configured as a second row of light-emitting components; the second row of light-emitting components in one row of pixel units of two adjacent rows of pixel units are arranged at a first side of the first row of light-emitting components in a column direction; and the second row of light-emitting components in another row of pixel units of two adjacent rows of pixel units are arranged at a second side of the first row of light-emitting components in the column direction; and the second electrodes of two adjacent second light-emitting components in two adjacent rows of the pixel units are close to each other; and the second electrodes of two adjacent third light-emitting components in two adjacent rows of the pixel units are close to each other.

9. The display panel as claimed in claim 8, wherein the first electrode and the second electrode of the first light-emitting components are spaced along a row direction; the first electrode and the second electrode of the second light-emitting components are spaced along the column direction; and the first electrode and the second electrode of the third light-emitting components are spaced along the column direction;
two adjacent first light-emitting components in two adjacent rows of the pixel units are partially staggered in the row direction; and the second electrodes of two adjacent first light-emitting components in two adjacent rows of the pixel units are close to each other; and/or
the second electrodes of two adjacent second light-emitting components in two adjacent rows of the pixel units are close to each other and overlap in the column direction; and the second electrodes of two adjacent third light-emitting components in two adjacent rows of the pixel units are close to each other and overlap in the column direction.

10. The display panel as claimed in claim 8, wherein the first electrode and the second electrode of the first light-emitting components are spaced along a row direction; the first electrode and the second electrode of the second light-emitting components are spaced along the column direction; and the first electrode and the second electrode of the third light-emitting components are spaced along the column direction;
two adjacent first light-emitting components in two adjacent rows of the pixel units are partially staggered in the row direction; and the second electrodes of two adjacent first light-emitting components in two adjacent rows of the pixel units are close to each other; and/or
the second electrodes of two adjacent second light-emitting components in two adjacent rows of the pixel units are close to each other and overlap in the row direction; and the second electrodes of two adjacent third light-emitting components in two adjacent rows of the pixel units are close to each other and overlap in the row direction.

11. A display device, comprising a display panel, a driving module applied to drive the display panel, and a housing, wherein the display panel comprises:
a drive substrate, comprising a plurality of sets of pads, wherein each set of pads comprises a first pad and a second pad;
a bonding layer, arranged on the plurality of sets of pads; and
a plurality of light-emitting components, wherein each light-emitting component comprises a semiconductor light-emitting layer, a first electrode, and a second electrode; the first electrode and the second electrode are respectively arranged at opposite ends of the semiconductor light-emitting layer; the first electrode is electrically connected to a corresponding first pad through the bonding layer; and, the second electrode is electrically connected to a corresponding second pad through the bonding layer;
wherein the second electrodes of at least part of the adjacent light-emitting components are close to each other; the distance between the second electrodes of the adjacent light-emitting components is less than the distance between the first electrodes of the adjacent light-emitting components; the second electrodes close to each other share a same bonding layer, and are each bonded to each of the corresponding second pads through the same bonding layer; and the second electrodes close to each other are connected to a same signal.

12. The display device as claimed in claim 11, wherein the display panel comprises a plurality of pixel units arranged in an array;
each pixel unit comprises three of the light-emitting components in different colors; each light-emitting component comprises a quantum dots layer; the semiconductor light-emitting layers of the three of the light-emitting components in different colors are in a same color; the quantum dots layers of the three of the light-emitting components in different colors are three different types of quantum dots layers;
a plurality of light-emitting components in each row of the pixel unit are alternately arranged in a same row based on a preset color order along the row direction; and the first electrodes and the second electrodes of the light-emitting components are spaced along the column direction;
each row of the pixel units is close to the second electrodes of two adjacent light-emitting components in one of the adjacent rows of the pixel units.

13. The display device as claimed in claim 11, wherein the bonding layer comprises a plurality of spaced sub-bonding layers; and a plurality of the second electrodes close to each other are each bonded to each of a plurality of the corresponding second pads respectively through the same sub-bonding layer.

14. The display device as claimed in claim 11, wherein the display panel comprises a plurality of pixel units arranged in an array; each pixel unit comprises three of the light-emitting components in different colors; and the second electrodes of two adjacent light-emitting components in two adjacent rows of the pixel units are close to each other.

15. The display device as claimed in claim 14, wherein the first electrodes and the second electrodes of two of the light-emitting components in the same pixel unit are spaced along the row direction; and the second electrodes of the two light-emitting components in the same pixel unit are close to each other; the first electrode and the second electrode of the other light-emitting component in the same pixel unit are spaced along the column direction.

16. The display device as claimed in claim 14, wherein the second electrodes of the three light-emitting components in the same pixel unit are close to each other; the three light-emitting components in the same pixel unit are arranged along the circumference; the angle between one of the light-emitting components and its adjacent light-emitting components in the same pixel unit is 90 to 180 degrees.

17. The display device as claimed in claim 14, wherein the second electrodes of the three light-emitting components in the same pixel unit are close to each other; the three light-emitting components in the same pixel unit are arranged along the circumference in a same spacing.

18. The display device as claimed in claim 14, wherein each of the pixel units comprises a first light-emitting component, a second light-emitting component, and a third light-emitting component in three different colors; a plurality of the first light-emitting components in a same row of the pixel units are configured as a first row of light-emitting components; a plurality of the second light-emitting components and a plurality of the third light-emitting components are alternately configured as a second row of light-emitting components; the second row of light-emitting components in one row of pixel units of two adjacent rows of pixel units are arranged at a first side of the first row of light-emitting components in a column direction; and the second row of light-emitting components in another row of pixel units of two adjacent rows of pixel units are arranged at a second side of the first row of light-emitting components in the column direction; and the second electrodes of two adjacent second light-emitting components in two adjacent rows of the pixel units are close to each other; and the second electrodes of two adjacent third light-emitting components in two adjacent rows of the pixel units are close to each other.

19. The display device as claimed in claim 18, wherein the first electrode and the second electrode of the first light-emitting components are spaced along a row direction; the first electrode and the second electrode of the second light-emitting components are spaced along the column direction; and the first electrode and the second electrode of the third light-emitting components are spaced along the column direction;

two adjacent first light-emitting components in two adjacent rows of the pixel units are partially staggered in the row direction; and the second electrodes of two adjacent first light-emitting components in two adjacent rows of the pixel units are close to each other; and/or the second electrodes of two adjacent second light-emitting components in two adjacent rows of the pixel units are close to each other and overlap in the column direction; and the second electrodes of two adjacent third light-emitting components in two adjacent rows of the pixel units are close to each other and overlap in the column direction.

20. The display device as claimed in claim 18, wherein the first electrode and the second electrode of the first light-emitting components are spaced along a row direction; the first electrode and the second electrode of the second light-emitting components are spaced along the column direction; and the first electrode and the second electrode of the third light-emitting components are spaced along the column direction;

two adjacent first light-emitting components in two adjacent rows of the pixel units are partially staggered in the row direction; and the second electrodes of two adjacent first light-emitting components in two adjacent rows of the pixel units are close to each other; and/or the second electrodes of two adjacent second light-emitting components in two adjacent rows of the pixel units are close to each other and overlap in the row direction; and the second electrodes of two adjacent third light-emitting components in two adjacent rows of the pixel units are close to each other and overlap in the row direction.

* * * * *